United States Patent [19]

Ewald

[11] Patent Number: 4,624,338

[45] Date of Patent: Nov. 25, 1986

[54] LOUDSPEAKER ENCLOSURE FOR A VIBRATING DIAPHRAGM LOUDSPEAKER

[75] Inventor: Gary T. Ewald, South Bend, Ind.

[73] Assignee: Electro-Voice, Incorporated, Buchanan, Mich.

[21] Appl. No.: 697,321

[22] Filed: Feb. 1, 1985

[51] Int. Cl.[4] .............................................. H05K 5/00

[52] U.S. Cl. .................................... 181/148; 181/144; 181/199; 181/294

[58] Field of Search ............... 181/146, 151, 290, 294, 181/144, 148, 199

[56] References Cited

U.S. PATENT DOCUMENTS

| | | | |
|---|---|---|---|
| 2,315,896 | 4/1943 | Dumas | 181/151 |
| 3,652,360 | 3/1972 | Hartman et al. | 181/290 X |
| 4,284,168 | 8/1981 | Gaus | 181/146 X |

OTHER PUBLICATIONS

"Oxboard Looking for Structural Future", Plywood Panel World, Oct. 1982.

*Primary Examiner*—Benjamin R. Fuller
*Attorney, Agent, or Firm*—Burmeister, York, Palmatier, Hamby & Jones

[57] ABSTRACT

A loudspeaker system employing a diaphragm type loudspeaker mounted in an opening in one of a plurality of walls of a hollow enclosure, the walls of the enclosure consisting of a plurality of layers disposed between surfaces thereof, the layers comprising a plurality of elongated strands of wood in a mass of solid resin, the axes of elongation of the strands in layers adjacent to the surfaces being generally parallel to a common plane and generally parallel to each other, the strands in adjacent layers being oriented with the axes of elongation of the strands in one layer normal to the axes of elongation of the strands in the adjacent layer. The enclosure has an axis of elongation and a transverse axis, and the strands in layers adjacent to the surfaces of the walls are generally parallel to the axis of elongation.

7 Claims, 2 Drawing Figures

LOUDSPEAKER ENCLOSURE FOR A VIBRATING DIAPHRAGM LOUDSPEAKER

The present invention relates to loudspeaker systems, and particularly to improvements in loudspeaker enclosures.

BACKGROUND OF THE INVENTION

Most loudspeakers use a vibrating diaphragm to couple mechanical energy developed from an electrical current to the air to produce acoustical energy. The diaphragm is suspended about its perimeter and vibrates along the central axis of the diaphragm. Most diaphragms for loudspeakers are in the form of cones or variations on cones.

It has been known for many years that the sound waves produced at the forward side of the loudspeaker diaphragm and the sound waves produced at the rearward side of the loudspeaker diaphragm are not in phase at all frequencies of the audible range. Accordingly, the sound waves produced at the rear side of the diaphragm, referred to as the back waves, interfere with sound produced at the forward side of the diaphragm. To eliminate or attenuate the back wave, loudspeakers are provided with baffles, the combination of the loudspeaker and baffle being known as a loudspeaker system. Loudspeaker baffles are preferably in the form of a hollow box, or enclosure, the enclosure having an opening in a wall to accommodatee the loudspeaker. Enclosures are sealed against air leakage except for the opening for the loudspeaker and in some cases a vent for acoustical purposes. Hence, the interior of the enclosure is subjected to the varying sound pressures produced by the back wave of the loudspeaker.

Ideally, a loudspeaker system should not color the sound in transforming electrical energy into acoustical energy. In order to avoid accentuating one frequency over another, resonances within the audible range must be avoided, whether those resonances are in the loudspeaker diaphragm or the enclosure. The walls of the loudspeaker enclosure are resonant at some frequency determined by the effective mass and stiffness of the wall. Even though the resonance may be damped, it is preferable that the mechanical resonance of the enclosure wall fall outside of the response range of the loudspeaker. The resonant frequency of the enclosure wall will be increased by descreasing the mass or increasing the effective stiffness of the wall. Hence, a wall with sufficiently low mass and sufficiently high stiffness can be made to have a resonant frequency above the response range of the loudspeaker. For those enclosure walls having a mechanical resonance in the response range of the loudspeaker, high stiffness and low mass will reduce the magnitude of the resonance.

A loudspeaker enclosure can also color the audio energy produced by generating sounds in the walls of the enclosure. A void in the wall of the enclosure will have at least one resonant frequency, and at that frequency, the void will cause the adjacent portions of the wall of the enclosure to vibrate excessively, thus creating a buzz or whistle which colors the acoustical energy produced. Hence, voids should be avoided in the walls of the enclosure.

Historically, wood has been the most popular material for loudspeaker enclosures. Wood is readily available, and in the past has been a relatively cheap construction material. Wood however is subject to nonuniformity, that is, the acoustical characteristics of wood vary with the type of wood and even with the particular piece of wood within a given category. Wood tends to have knots, and the knots tend to come loose. A loose knot will vibrate, and other sounds can be generated by voids. The stiffness and mass of wood will vary between different pieces of wood of the same general characteristics. Wood also has become costly in recent years.

Plywood has also been used in loudspeaker enclosures, often augmented by a vinyl wrap to improve the appearance of the enclosure. Plywood generally has at least three layers of wood, each layer having a grain which is oriented perpendicular to the adjacent layers. Plywood aften has voids, and often has an irregular outer surface making it more difficult to produce a loudspeaker enclosure which is attractive, either by treating the plywood itself, or cementing a vinyl wrap on the plywood. Voids in plywood are particularly objectionable in that they produce coloring sounds. Additionally, plywood tends to delaminate when subjected to moisture or temperature change.

More recently, particle board has been used for loudspeaker enclosures. Particle board comprises small generally uniform particles of wood or other fibrous materials in a plastic binder. Particle board generally has a high ratio of binder to wood particles, and the stiffness to weight ratio of particle board is lower than that of plywood. Accordingly, particle board results in an enclosure which is heavier than that of plywood, assuming the same wall stiffness.

Cast metal enclosures have also been used for loudspeakers, but these tend to be used only for very small loudspeakers in view of the cost of such structures. They are difficult to mold, and in addition, they generally utilize very thin walls and depend upon damping to avoid mechanical resonances.

SUMMARY OF INVENTION

It is an object of the present invention to provide an enclosure for a loudspeaker having walls substantially free of voids and constructed of material with a uniformity at least equal to that of particle board and a stiffness to weight ratio at least equal to that of plywood.

It is a further object of the present invention to provide such an enclosure for a loudspeaker which is particularly suitable for portable loudspeakers. Loudspeakers used for bands, performing groups, or public address work are moved from place to place, but must be capable of handling large amounts of power and producing quality sound. Often such loudspeakers are subjected to moisture either in transit or in operation, and the moisture adversely affects the materials of the enclosure. For example, plywood tends to delaminate when subjected to moisture. Portable loudspeakers also require relatively light enclosures in order to facilitate transport.

The objects of the present invention have been achieved with a loudspeaker enclosure constructed with walls formed by a plurality of layers consisting of small elongated strands of wood immersed in a binder, the axes of elongation of the strands in each layer being generally parallel to a common axis, and the strands in adjacent layers being parallel to axes disposed at right angles to each other. The axes of elongation in the layers at the surface of the walls are parallel to the axis of elongation of that wall. The exterior surface of the walls of such an enclosure are smooth, and a layer of plastic in the form of cloth or carpet is cemented on the exterior surface.

DESCRIPTION OF THE DRAWINGS

The present invention and its objects and advantages will be more readily apparant from the following specification, particularly when viewed in the light of the drawings, in which.

SPECIFICATION

Figure 2:
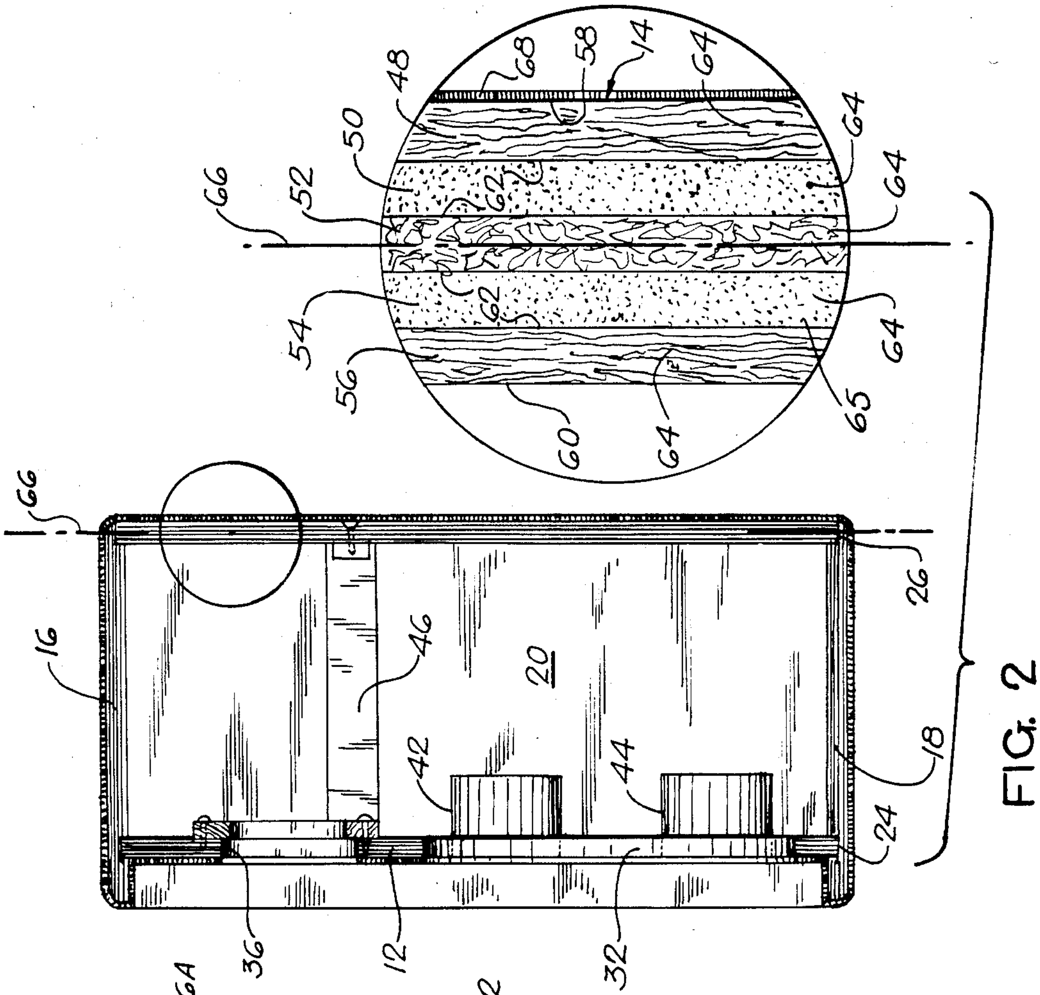
FIG. 2 is a sectional view taken along the line 2—2 of FIG. 1.

The loudspeaker enclosure 10 is a generally rectangular box formed by a front wall 12, back wall 24, top wall 26, bottom wall 18, and side walls 20 and 22. Each of the walls is carefully sealed to the adjacent walls and cemented thereto in order to prevent passage of air through the joints between the walls. As shown in FIG. 2, the top wall and bottom wall are provided with recesses 24 and 26 which engage the front wall 12 and back wall 24, respectively, to provide an elongated gluing surface to make certain that the top wall 16 and bottom wall 18 are secured to the front wall 12 and back wall 14 and acoustically sealed with respect thereto. The side walls 20 and 22 are also provided with recesses 28 and 30 which accommodate the bottom wall 18 and provide extended gluing surfaces to assure a tight mechanical fit and an acoustical seal between the bottom wall 18 and side walls 20 and 22. A similar construction is employed to secure the top wall 16 to the side walls 20 and 22, front wall 12 and back wall 14.

The front wall 12 is provided with an opening 32 for accommodating a loudspeaker for producing low frequency sounds. In addition, the front wall 12 is provided with a second opening 34 for a mid-range loudspeaker and a third opening 36 for a horn tweeter. Two circular vents 38 and 40 are positioned between the opening 32 and the side wall 20, and each of the vents is provided with a cylindrical tube 42 and 44 which extends into the enclosure from the vents 38 and 40, respectively. A wooden brace 46 extends between the front wall 12 and back wall 14 on the interior surface of each of the side walls 20 and 22, and is glued in position.

Figure 1:
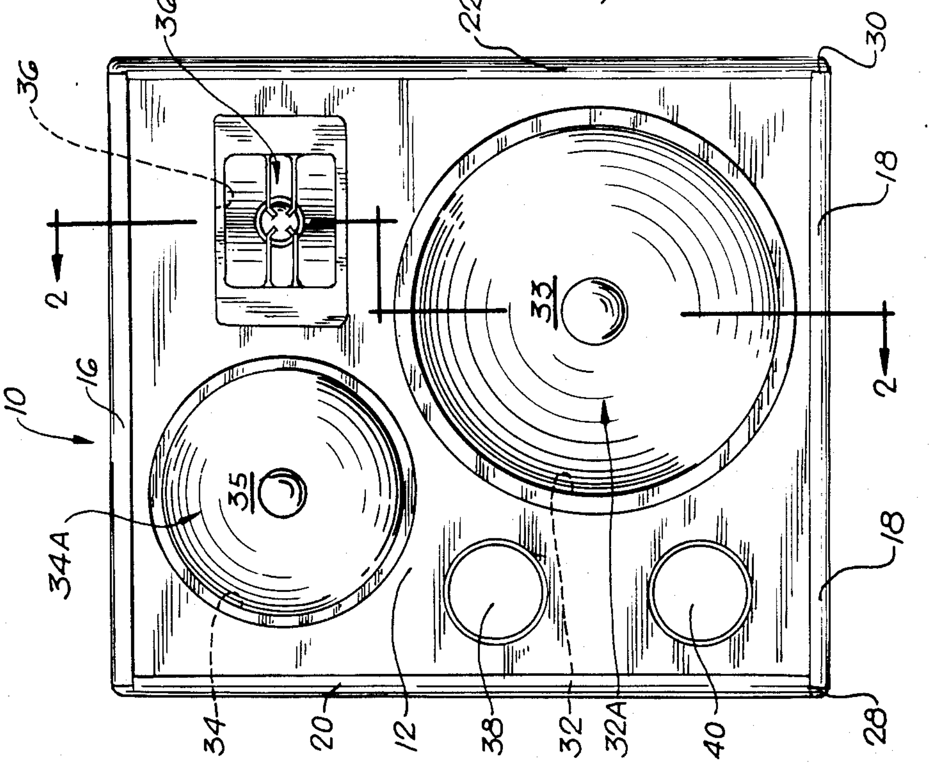
FIG. 1 is a front elevational view of a loudspeaker enclosure constructed according to the teachings of the present invention.

FIG. 1 shows a low frequency loudspeaker 32A mounted in the opening 32 with a diaphragm 33 acoustically sealed on and mechanically attached to the front wall 12. Also, a mid-range loudspeaker 34A is mounted in the opening 34 and has a diaphragm 35 mounted on and sealed to the front wall 12. A horn tweeter 36A is mounted in the opening 36 and closes the opening 36 to sound waves. The loudspeakers 32A, 34A and 36A have been omitted from FIG. 2 for clarity.

FIG. 2 illustrates the composition of the walls 12, 14, 16, 18, 20, and 22. Each of the walls has five layers designated 48, 50, 52, 54 and 56. The layers abut each other to form a stack which extends between the one surface 58 of the wall and the other surface 60 of the wall. For clarity, the interface between each of the layers is shown at 62, but it will be understood that one layer merely blends into the adjacent layer.

Each of the layers consists of a plurality of strands 64 of wood particles and a phenolic resin binder 65. The strands have axes of elongation which are significantly longer than the thickness or transverse axes of the strands. The length of the strands varies between approximately 30 and 60 mm., and the transverse axes and thickness of the strands vary between approximately 5 and 10 mm.

The layers 48 and 56, which are adjacent to the one surface 58 and the other surface 60, respectively, are provided with strands which have their major axes parallel to a plane perpendicular to the plane of FIG. 2, that plane extending parallel to the interfaces 62. Further, the major axes of the strands 64 are parallel to the major axis of the wall 14, that axis being indicated at 66 in FIG. 2.

The strands 64 in the core layer 52 are not oriented in any particular way with respect to the axis 66 of the wall 14 or with respect to the plane of the figure or the plane of the interfaces 62 between the layers 50, 52 and 54, the orientation of the strands 62 being substantially random. The layers 50 and 54 however have strands 64 which are generally parallel to each other and to the plane of the interfaces 62 with adjacent layers 52 and 48 or 56. In addition, the strands 64 in the layers 50 and 54 have major axes disposed normal to the major axes of the strands 64 in the layers 48 and 56.

The core layer 52, by virtue of the random orientation of the strands 64, will resist bending about the axis of elongation 66 about the same as bending about an axis perpendicular to the plane of FIG. 2, assuming equal lengths of layer with respect to the two axes. The layers 50 and 54, however, will resist bending to a greater degree about the axis 66 than about an axis perpendicular to the plane of FIG. 2, assuming equal lengths for the layers 50 and 54 with respect to both axes. Likewise, the layers 48 and 56 will resist bending about an axis perpendicular to the plane of FIG. 2 to a greater degree than about the axis 66, assuming equal lengths of layers with respect to each axis. Because of the fact that the layers 50 and 54 are closer to the core layer 52, the wall 14 as a whole will bend more readily about the axis 66 than about an axis perpendicular to the plane of FIG. 2.

It should be understood that the strands 64 in the layers 48, 50, 54 and 56 are only generally oriented with respect to the axis 66 as described above, and in the context of the subject matter described herein, generally oriented means that 80% of the strands are disposed at an angle no greater than 20° with respect to the axis 66.

Because the wall 14 is stiffer against bending about an axis perpendicular to the longitudinal axis 66 thereof, it will exhibit greater stiffness against resonances against its longitudinal axis. This is desirable in an enclosure for a loudspeaker since the lower frequencies tend to resonate the longer elements of structure and contain more power than the higher frequencies. Hence, the strands in the outer layers 48 and 56 of the wall 14 are aligned parallel to the longitudinal axis of the wall 14. In like manner, the stands of the outer layers of the walls 12, 16, 18, 20 and 22 are aligned with the longitudinal axes of these panels.

While walls 12, 14, 16, 18, 20 and 22 may be constructed in the manner indicated above, particularly with reference to FIG. 2, to be devoid of voids, and to have suitable stiffness characteristics, the exterior surface of the panels is subject to delamination as well as scuffing and abrasion. Moisture tends to eat away the phenolic resin and loosen the surface strands. A layer of plastic material, illustrated at 68, is cemented on the exterior surface 58 of the walls 12, 14, 16, 18, 20 and 22 to protect these surfaces from the adverse effects of moisture. The layer 68 is preferably a layer of vinyl carpet which has outwardly extending fibers which resist scuffing and abrasion as well as protect against moisture.

From the foregoing description of the present invention, those skilled in the art will readily discover advantages and devise uses for the present invention above and beyond that here described. It is therefore intended that the scope of the present invention be not limited by the foregoing specification, but rather only by the appended claims.

The invention claimed is:

1. A loudspeaker system comprising, in combination, a plurality of walls mounted together to form a hollow enclosure, the enclosure having an opening in one wall thereof, a loudspeaker having a diaphragm, the diaphragm being mounted on the enclosure confronting the opening in the wall and being acoustically sealed to the wall about the opening characterized by the construction wherein the walls of the enclosure consist of a plurality of layers disposed between one surface of the wall and another surface of the wall, each layer being contiguous to adjacent layers, each layer comprising a plurality of elongated strands of wood embedded in a mass of solid resin, each strand having an axis of elongation and a shorter transverse axis normal thereto, the axes of elongation of the strands in a layer adjacent to the one surface being generally parallel to a common plane and generally parallel to each other, and the strands in the layer adjacent to said layer having their axes of elongation generally parallel to the same plane and generally normal to the axis of elongation of the strands in said layer.

2. A loudspeaker system comprising the combination of claim 1 wherein the wall of the enclosure has an axis of elongation longer than a transverse axis, and the axis of elongation of the strands in the layer adjacent to the one surface being generally parallel to the axis of elongation of the wall.

3. A loudspeaker system comprising the combination of claim 1 wherein each wall has a core layer and at least two layers between the core layer and the one surface of the wall, the core layer having substantially randomly oriented strands.

4. A loudspeaker system comprising the combination of claim 3 wherein each wall has five layers including two layers disposed between the core layer and the other surface of the wall, the axes of elongation of the strands in the layers between the core layer and the other surface being generally parallel to the common plane and in each of said layers generally parallel to each other, the axes of elongation of the strands in the layer adjacent to the other surface being generally normal to the axes of elongation of the strands of the adjacent layer and generally parallel to the axes of elongation of the strands in the layer adjacent to the one surface.

5. A loudspeaker system comprising the combination of claim 4 wherein the wall of the enclosure has an axis of elongation longer than a transverse axis, and the axis of elongation of the strands in the layers adjacent to the one and other surfaces are disposed generally parallel to the axis of elongation of the wall.

6. A loudspeaker system comprising the combination of claim 5 wherein the strands have axes of elongation between 30 and 80 millimeters.

7. A loudspeaker system comprising the combination of claim 6 wherein the wall has a thickness between 0.5 and 1.0 inch and a density between 35 and 45 pounds per cubic foot.

* * * * *